United States Patent
Nadarajan et al.

(10) Patent No.: US 10,408,879 B2
(45) Date of Patent: Sep. 10, 2019

(54) METHOD AND APPARATUS FOR DIAGNOSING A FAULT CONDITION IN AN ELECTRIC MACHINE

(71) Applicant: ROLLS-ROYCE plc, London (GB)

(72) Inventors: Sivakumar Nadarajan, Singapore (SG); Amit K. Gupta, Singapore (SG); Vaiyapuri Viswanathan, Singapore (SG)

(73) Assignee: ROLLS-ROYCE plc, London (GB)

( * ) Notice: Subject to any disclaimer, the term of this patent is extended or adjusted under 35 U.S.C. 154(b) by 19 days.

(21) Appl. No.: 15/705,716

(22) Filed: Sep. 15, 2017

(65) Prior Publication Data
US 2018/0100895 A1   Apr. 12, 2018

(30) Foreign Application Priority Data
Oct. 10, 2016 (GB) .................................. 1617138.1

(51) Int. Cl.
| | | |
|---|---|---|
| G01R 31/34 | (2006.01) | |
| G01H 1/00 | (2006.01) | |
| G01M 1/16 | (2006.01) | |
| G01H 3/04 | (2006.01) | |
| G01H 3/08 | (2006.01) | |

(52) U.S. Cl.
CPC .......... *G01R 31/346* (2013.01); *G01H 1/003* (2013.01); *G01H 3/04* (2013.01); *G01M 1/16* (2013.01); *G01H 3/08* (2013.01)

(58) Field of Classification Search
CPC ..................................................... G01M 1/16
See application file for complete search history.

(56) References Cited

U.S. PATENT DOCUMENTS

| | | |
|---|---|---|
| 4,722,226 A | 2/1988 | Edmonds |
| 4,980,844 A | 12/1990 | Demjanenko et al. |
| 7,592,772 B2 | 9/2009 | Nandi et al. |

(Continued)

FOREIGN PATENT DOCUMENTS

| | | |
|---|---|---|
| EP | 3193155 A1 | 4/2002 |
| EP | 2469703 A2 | 6/2012 |

(Continued)

OTHER PUBLICATIONS

Siddiqui et al.; "Health Monitoring and Fault Diagnosis in Induction Motor—A Review;" International Journal of Advanced Research in Electrical, Electronics and Instrumentation Engineering; Jan. 2014, vol. 3, Issue 1.

(Continued)

*Primary Examiner* — Clayton E. LaBalle
*Assistant Examiner* — Jas A Sanghera
(74) *Attorney, Agent, or Firm* — Oliff PLC

(57) ABSTRACT

A method for diagnosing a fault condition in an electric machine includes measuring at least one physical parameter generated during operation of the electric machine; analyzing the or each measured parameter in a frequency domain; and determining whether the electric machine has a stator or rotor winding fault based on a comparison of an amplitude of the or each analyzed parameter at a first predetermined frequency and a first threshold amplitude for the first frequency. The at least one physical parameter includes a sound generated by the electric machine.

18 Claims, 10 Drawing Sheets

(56) References Cited

U.S. PATENT DOCUMENTS

2006/0283190 A1* 12/2006 Thomassin ............ G01M 15/12
60/772
2010/0145639 A1 6/2010 Fu et al.

FOREIGN PATENT DOCUMENTS

| | | |
|---|---|---|
| EP | 3203226 A1 | 8/2017 |
| WO | 2016/039088 A1 | 3/2016 |

OTHER PUBLICATIONS

Trutt et al.; "Detection of A-C Machine Winding Deterioration Using Electrically Excited Vibrations"; Industry Applications Conference; p. 1903-1907; 1999.

J. Sottile et al; "Condition Monitoring of Brushless Three-Phase Synchronous Generators With Stator Winding or Rotor Circuit Deterioration;" IEEE Transactions on Industry Applications; p. 1209-1215; Sep./Oct. 2006; vol. 42, No. 5.

B S Payne et al; "Componential coding in the condition monitoring of electrical machines Part 2: application to a conventional machine and a novel machine;" Proc. Instn Mech. Engrs, J. Mechanical Engineering Science; p. 901-916; 2003; vol. 217, Part C.

A. Gaylard et al.; "Acoustic Evaluation of Faults in Electrical Machines;" Electrical Machines and Drives; p. 147-150; Sep. 11-13, 1995.

M. Ploj Virtic et al.; "Using of Acoustic Models in Mechanical Diagnostics;" Journal of Mechanical Engineering; p. 874-882; 2008; vol. 54.

J. Penman et al.; "The Detection of Stator and Rotor Winding Short Circuits in Synchronous Generators by Analysing Excitation Current Harmonics;" Opportunities and Advancements in International Power Generation; p. 137; Mar. 18-20, 1996.

S. Singh et al.; "Detection of Bearing Faults in Mechanical Systems Using Motor Current Signature and Acoustic Signatures;" The 21st International Congress on Sound and Vibration; p. 1-8; Jul. 13-17, 2014.

M. Iorgulescu; "Study Relation Between Fault Noise in Electric Motor;" International Journal on "Technical and Physical Problems of Engineering;" p. 69-73; Dec. 2010; vol. 2; No. 4; Issue 5.

K. Shibata et al.; "Fault Diagnosis of Rotating Machinery Through Visualisation of Sound Signals;" Mechanical Systems and Signal Processing; 2000; p. 229-241; vol. 14, No. 2.

R. Li.; "Rotating Machine Fault Diagnostics Using Vibration and Acoustic Emission Sensors;" Thesis submitted to the University of Illinois at Chicago; p. 1- 234; 2012.

Mar. 13, 2017 Search Report issued in Great Britain Application No. GB1617138.1.

Jin et al.; "A Vibration-Based Approach for Stator Winding Fault Diagnosis of Induction Motors: Application of Envelope . . . ;" Rese; p. 1-10; 2011.

Feb. 19, 2018 Search Report issued in European Patent Application No. 1719278.

* cited by examiner

METHOD AND APPARATUS FOR DIAGNOSING A FAULT CONDITION IN AN ELECTRIC MACHINE

The disclosure relates to a method and fault diagnosis apparatus for diagnosing a fault condition in an electric machine.

Electric machines, such as Wound Field Brushless Synchronous Generators (WFBLSGs), are used in a variety of safety and mission critical applications, and, thus, their reliability is of utmost importance. Synchronous machines such as WFBLSGs are particularly susceptible to stator faults. Examples of stator faults include winding faults such as turn-to-turn short circuit faults (i.e. inter-turn short circuit faults), phase-to-ground faults and phase-to-phase faults. Turn-to-turn short circuit faults are initiated by winding insulation degradation. Although turn-to-turn short circuit faults are in themselves a low-impact form of fault, they can lead to phase-to-ground faults and phase-to-phase faults, both of which are catastrophic. Although condition monitoring techniques for detecting and diagnosing stator winding faults do exist, they are deficient in a number of respects.

It is therefore desirable to provide an improved method and fault diagnosis apparatus for diagnosing a fault condition in an electric machine.

According to an aspect of the disclosure, there is provided a method for diagnosing a fault condition in an electric machine. The method comprises: measuring at least one physical parameter generated during operation of the electric machine; analyzing the or each measured parameter in a frequency domain; and determining whether the electric machine has a stator or rotor winding fault based on a comparison of an amplitude of the or each analyzed parameter at a first predetermined frequency and a first threshold amplitude for the first frequency. The at least one physical parameter comprises a sound generated by the electric machine.

The first threshold amplitude may be an upper threshold amplitude. The electric machine may be determined to have a stator or rotor winding fault if the amplitude of the analyzed sound at the first frequency is above the upper threshold amplitude.

The method may further comprise determining whether the electric machine is unbalanced based on a comparison of an amplitude of the or each analyzed parameter at a second predetermined frequency and a second threshold amplitude for the second frequency.

The step of determining whether the electric machine has a stator or rotor winding fault may be carried out only if it is determined that the electric machine is not unbalanced.

The second threshold amplitude may be a lower threshold amplitude. The electric machine may be determined to be unbalanced if the amplitude of the or each analyzed parameter at the second frequency is below the lower threshold amplitude.

The at least one physical parameter may further comprise an electrical parameter and/or a mechanical parameter of the electric machine.

Determining whether the electric machine has a stator or rotor winding fault and/or is unbalanced may be based on an average of the difference between the amplitudes of the analyzed parameters and the threshold amplitudes.

The electric machine may be determined to be healthy if one or fewer of the parameters have amplitudes which when compared with the respective threshold amplitude satisfy a criteria which suggests that the electric machine has a stator or rotor winding fault or is unbalanced.

The method may further comprise determining the type of electric machine and/or the loading the electric machine is subjected to. The or each predetermined frequency and its respective threshold amplitude may be determined based on the type of electric machine and/or its loading.

The loading the electric machine is subjected to may comprise a level of loading and/or whether the loading is linear or non-linear.

The or each predetermined frequency and its respective threshold amplitude may be obtained from a database.

The step of analyzing the or each measured parameter in a frequency domain may comprise generating a spectrogram from the measured parameter. The amplitude of the or each analyzed parameter may be determined from the spectrogram.

The sound generated by the electric machine may be measured using an acoustic sensor spaced from the electric machine.

The electric machine may be an electric generator.

The electric generator may be a Wound Field Brushless Synchronous Generator (WFBLSG).

The stator or rotor winding fault may be a turn-to-turn short circuit stator or rotor winding fault.

According to another aspect of the disclosure, there is provided a fault diagnosis apparatus for diagnosing a fault condition in an electric machine. The fault diagnosis apparatus comprises an acoustic sensor and a processor. The acoustic sensor is configured to measure a sound generated by the electric machine. The processor is configured to: analyze the measured sound in a frequency domain; and determine whether the electric machine has a stator or rotor winding fault based on an amplitude of the analyzed sound at a first frequency and a first condition.

The invention may comprise any combination of the features and/or limitations referred to herein, except combinations of such features that are mutually exclusive.

Arrangements will now be described, by way of example, with reference to the accompanying drawings, in which.

Figure 1:
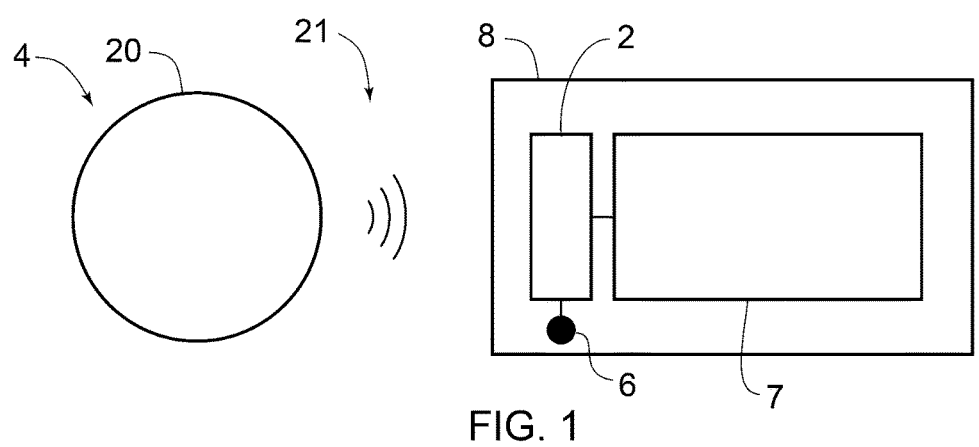
FIG. 1 is a plan schematic view of an example fault diagnosis apparatus for detecting and diagnosing a fault in an electric machine.

FIG. 1 shows a fault diagnosis apparatus 2 for diagnosing a fault condition in an electric machine 4. The electric machine 4 is a wound field brushless synchronous generator (WFBLSG), and comprises a rotor and a stator (not shown)

housed within a housing 20. The stator comprises a plurality of stator windings, each comprising a plurality of insulated coils. The stator windings are susceptible to stator winding faults such as turn-to-turn short circuit faults (i.e. inter-turn short circuit faults), phase-to-ground faults and phase-to-phase faults. The stator comprises three terminals, each terminal being connected to grid or a separate load, for example a lighting load, a pump load or a motor load. Ideally, the magnitudes of the loads connected to each terminal are the same. If loads having different magnitudes are connected to one or more of the terminals, the electric machine 4 is considered to have a load unbalance condition.

The fault diagnosis apparatus 2 generally comprises a sensor 6, a processor 8 and a display 7. The fault diagnosis apparatus 2 may form part of a mobile phone or a tablet computer. Alternatively, the fault diagnosis apparatus 2 may be a dedicated device. In use, the sensor 6 is positioned externally with respect to the electric machine 4, and is separated from the electric machine 4 by an air gap 21. The sensor 6 is an acoustic sensor (such as a microphone) configured to measure sound (i.e. acoustic waves) produced by the electric machine 4, and output a signal to the processor 8 that corresponds to the measured sound. The sensor 6 is configured to measure sound in the frequency range of a few hertz to 20 kilohertz. The fault diagnosis apparatus 2, in particular the processor 8, is configured to diagnose a fault condition based on characteristics in the sound generated by the electric machine 4. The characteristics may indicate the presence or absence of stator winding faults, in particular stator winding faults such as turn-to-turn short circuit faults, phase-ground faults and phase-phase faults, or a load unbalance fault. The diagnosis made by the processor 8 may be displayed on a display 7, thereby allowing a user to take an appropriate course of action based on the diagnosis.

Figure 2:
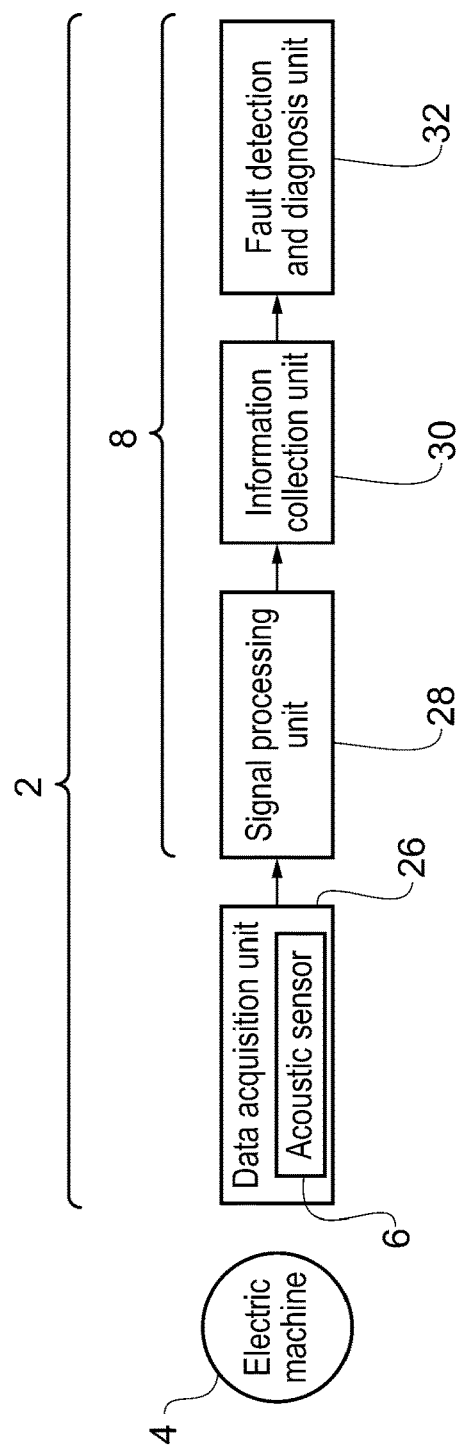
FIG. 2 is a schematic view of a first example of a system architecture used in the fault diagnosis apparatus.

FIG. 2 shows a first example architecture used in the fault diagnosis apparatus 2. As shown, the fault diagnosis apparatus 2 comprises a data acquisition unit 26, a signal processing unit 28, an information collection unit 30 and a fault detection and diagnosis unit 32. The sensor 6 forms part of the data acquisition unit 26. The signal processing unit 28, information collection unit 30 and fault detection and diagnosis unit 32 form part of the processor 8.

Figure 3:
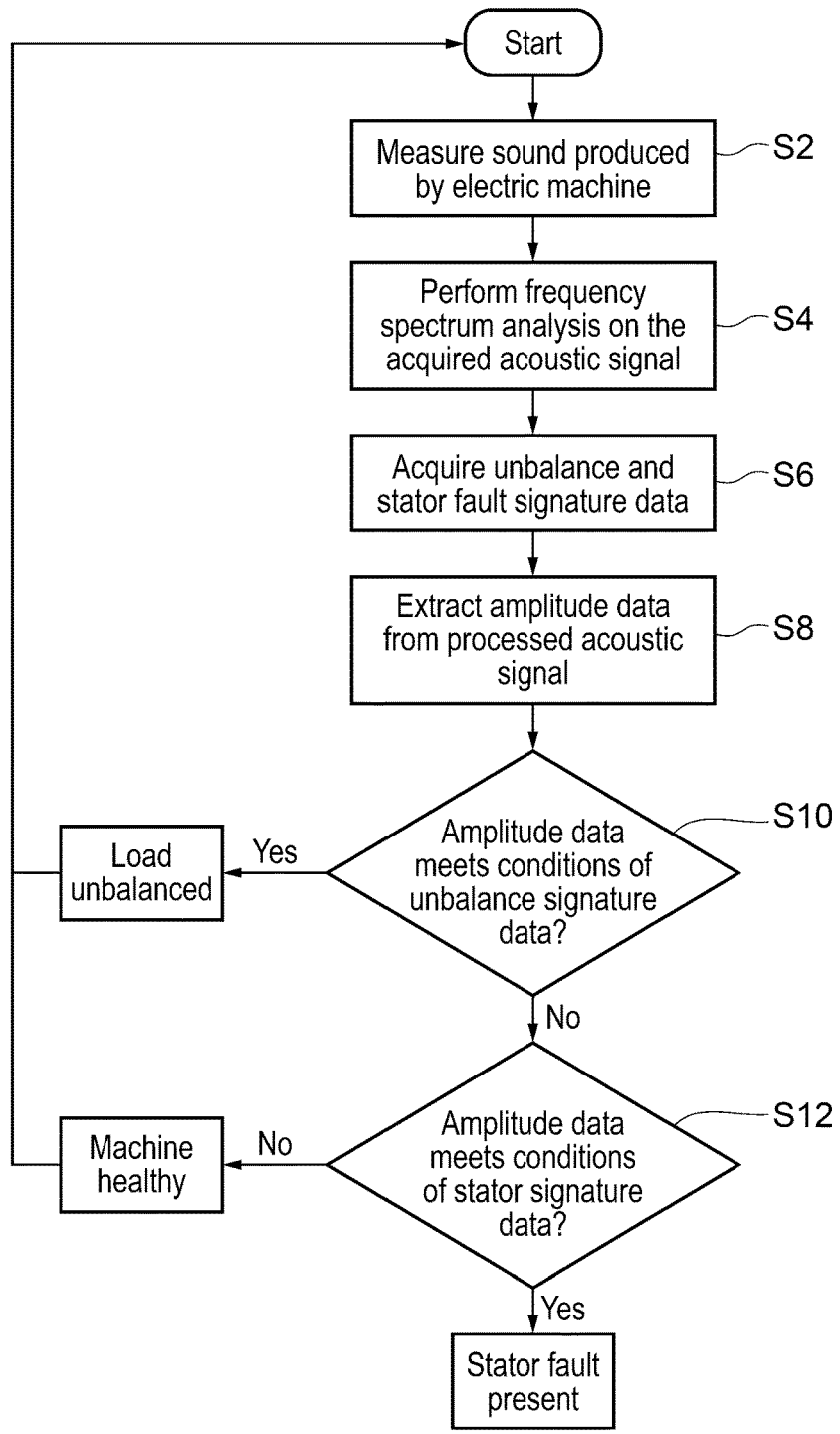
FIG. 3 is a flow diagram of a first example method performed by the fault diagnosis apparatus using the architecture of FIG. 2.

The fault diagnosis apparatus 2 is described with reference to FIG. 3, which shows a flow diagram of a first example method performed by the fault diagnosis apparatus 2 using the first example architecture. Upon initiation of the fault diagnosis apparatus 2, step S2 is carried out by the data acquisition unit 26. During step S2, power is supplied to the electric machine 4 such that the rotor moves relative to the stator. This movement generates sound, which is transmitted through the air gap 21 to the sensor 6. The sensor 6 is thus able to measure the sound generated by the electric machine 4 over a period of time, and subsequently output a signal in the form of an electrical signal to the signal processing unit 28 that is representative of the sound generated by the electric machine 4.

Step S4 is carried out by the signal processing unit 28. The signal processing unit 28 comprises a spectrograph. The spectrograph receives the signal from the data acquisition unit 26 and performs frequency spectrum analysis on it so as to generate a spectrogram based on the signal.

Figure 4:
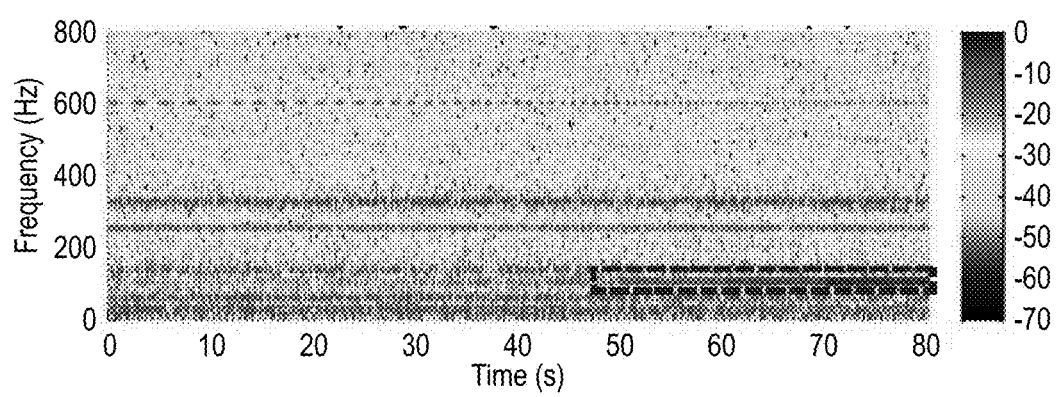
FIG. 4 is a time-frequency spectrogram for a WFBLSG under linear load at a loading level of 40%.

FIG. 4 shows an example of a spectrogram. As shown, the spectrogram is a frequency-time plot, with both the frequency and time axes being represented linearly. The amplitude of the signal received from the data acquisition unit 26 at a specified frequency and at a specified time is represented on the spectrogram by the color of the spectrogram at a position corresponding to that particular frequency and time. The spectrogram may show up to 20th order harmonics.

The spectrogram shown in FIG. 4 is generated by the signal processing unit 28 in step S4 for a first example electric machine, operated over a period of 80 seconds. The measured frequency range is from 0 to 800 Hertz. The amplitude is represented in decibels. The 0 decibel reference value is selected such that all amplitudes are displayed as having a negative decibel amplitude.

Returning to FIG. 3, step S6 is carried out by the information collection unit 30. The information collection unit 30 comprises a knowledge base (i.e. a database), which contains signature data. The signature data can be determined experimentally or mathematically. The signature data comprises load unbalance condition signature data and stator winding fault signature data. In the present arrangement, the stator winding fault signature data relates to turn-to-turn short circuit faults (i.e. inter-turn short circuit faults). However, in other arrangements, the stator winding fault signature data may relate to other stator winding faults such as phase-to-ground faults and phase-to-phase faults. A signature data set comprising load unbalance condition signature data and stator winding fault signature data exists for a variety of different types of electric machine 4 (for example WFBLSGs or brushed DC motors) operating under a variety of different loading conditions. The loading conditions relate to the type of load that the electric machine 4 is subjected to (e.g. linear or non-linear load) and the level of loading that the electric machine 4 is subjected to (e.g. 40% loading or 60% loading).

The load unbalance condition signature data for each type of electric machine 4 under each type of loading condition comprises a frequency value (hereinafter referred to as the unbalance signature frequency) and an associated threshold condition (hereinafter referred to as the unbalance signature threshold condition). Likewise, the stator winding fault condition signature data for each type of electric machine 4 under each type of loading condition comprises a frequency value (hereinafter referred to as the stator signature frequency) and an associated threshold condition (hereinafter referred to as the stator signature threshold condition). The unbalance signature threshold condition and the stator signature threshold condition each comprise an amplitude value and an indication as to whether the amplitude value is an upper threshold or a lower threshold. Step S6 comprises identifying what type of electric machine 4 is being tested, what type of loading it is being subjected to, and retrieving the associated load unbalance condition signature data and stator winding fault condition signature data from the knowledge base.

Step S8 is also carried out by the information collection unit 30. In step S8, an amplitude (hereinafter referred to as the extracted unbalance amplitude) at the unbalance signature frequency at a current or recently elapsed time is extracted (i.e. measured or determined) from the spectrogram. Likewise, an amplitude (hereinafter referred to as the extracted stator amplitude) at the stator signature frequency at the current or recently elapsed time is also extracted (i.e. measured or determined) from the spectrogram. The extracted unbalance amplitude and the extracted stator amplitude may represent the amplitudes of the spectrogram at a single, discrete point in time. Alternatively, they may represent the average amplitude of the spectrogram over a period of time, for example 1 second. The extracted unbalance amplitude and the extracted stator amplitude, along with their associated unbalance signature threshold condition and stator signature threshold condition, are outputted to the fault detection and diagnosis unit 32, whereupon step S10 takes place.

Step S10 is carried out by the fault detection and diagnosis unit 32. In step S10, a preliminary check is carried out in order to ensure that the electric machine 4 does not have a load unbalance condition. Specifically, the extracted unbalance amplitude is assessed as to whether it meets the conditions prescribed by the unbalance signature threshold condition. If the extracted unbalance amplitude does meet the conditions prescribed by the unbalance signature threshold condition, the electric machine 4 is determined to have a load unbalance condition, whereupon step S2 is repeated. This error condition may be displayed on the display 7. If the extracted unbalance amplitude does not meet the conditions prescribed by the unbalance signature threshold condition, the electric machine 4 is determined not to have a load unbalance condition, whereupon step S12 is carried out.

Step S12 is also carried out by the fault detection and diagnosis unit 32. In step S12, a main check is carried out in order to determine whether the electric machine 4 has a stator winding fault, in particular a turn-to-turn short circuit fault (i.e. an inter-turn short circuit fault). Specifically, the extracted stator amplitude is assessed as to whether it meets the conditions prescribed by the stator signature threshold condition. If the extracted stator amplitude does meet the conditions prescribed by the stator signature threshold condition, the electric machine 4 is determined to have a stator winding fault. This error condition may be displayed on the display 7. If the extracted stator amplitude does not meet the conditions prescribed by the stator signature threshold condition, the electric machine 4 is determined not to have a stator winding fault and to be healthy, whereupon step S2 is repeated. The healthy condition of the electric machine 4 may be displayed on the display 7, until such time as the electric machine 4 is determined to have an error condition.

The abovementioned method ensures early detection of stator winding faults, which, if left undetected, may develop into catastrophic faults. Early fault detection allows a system to move from scheduled maintenance to predictive maintenance, which increases the availability of the electric machines 4. Furthermore, acoustic based winding fault detection is simple, non-intrusive and easy to implement. The method does not require current and voltage sensors, which must be rated equally to the power rating of the electric machine 4. The use of an acoustic sensor 6 is non-intrusive. Specifically, electric machine 4 need not be modified in order for the acoustic sensor 6 to accurately measure the sound generated by the electric machine 4. Further, the acoustic sensor 6 need not even be in contact with the electric machine 4, and can be spaced therefrom by an air gap 21. Accordingly, the use of mountings for the sensor 6 on the electric machine 4 is obviated. Further, since the acoustic sensor 6 is not integral with the electric machine 4, it does not affect the operation of the electric machine 4, and, as such, the measurements taken by the sensor 6. Consequently, the accuracy of the sound produced by the electric machine 4 and sensed by the sensor 6 is improved, thus improving accuracy of fault detection.

The first example method will now be illustrated with reference to an actual electric machine 4 under a known loading condition. In the following example, the electric machine 4 is a WFBLSG, the type of load is a linear load, and the level of loading is 40%. The spectrogram generated by the signal processing unit 28 in step S4 for this type of electric machine 4 under these loading conditions is shown in FIG. 4 (referred to previously).

In step S6, the type of electric machine 4 being tested is identified as a WFBLSG under linear load at 40% loading. An unbalance signature frequency, an unbalance signature threshold condition, a stator signature frequency and a stator signature threshold condition for a WFBLSG under linear load at 40% loading are retrieved from the knowledge base. In the present example, the unbalance signature frequency is 500 Hertz, the unbalance signature threshold condition is less than −30 decibels, the stator signature frequency is 100 Hertz and the stator signature threshold condition is greater than −15 decibels.

In step S8, the amplitude at the unbalance signature frequency of 500 Hertz (i.e. the extracted unbalance amplitude) is extracted from the spectrogram and determined to be −25 decibels. Likewise, the amplitude at the stator signature frequency of 100 Hertz (i.e. the extracted stator amplitude) is extracted from the spectrogram and determined to be −20 decibels.

In step S10, the extracted unbalance amplitude of −25 decibels is determined not to meet the requirements of the unbalance signature threshold condition of being less than −30 decibels. Accordingly, the electric machine 4 is determined not to have a load unbalance condition, whereupon step S12 is carried out.

In step S12, the extracted stator amplitude of −20 decibels is determined not to meet the requirements of the stator signature threshold condition of being greater than −15 decibels. Accordingly, the electric machine 4 is determined not to have a stator winding fault condition and to be healthy, whereupon step S2 is carried out.

This process repeats, until approximately 50 seconds has elapsed. After 50 seconds has elapsed, in step S8, the extracted unbalance amplitude is again determined to be −25 decibels. In contrast, extracted stator amplitude is now determined to be −10 decibels.

In step S10, the extracted unbalance amplitude of −25 decibels is again determined not to meet the requirements of the unbalance signature threshold condition of being less than −30 decibels. Accordingly, again, the electric machine 4 is determined not to have a load unbalance condition, whereupon step S12 is carried out.

In step S12, the extracted stator amplitude of −10 decibels is determined to meet the requirements of the stator signature threshold condition of being greater than −15 decibels. Accordingly, the electric machine 4 is determined to have a stator winding fault condition.

Figure 5:
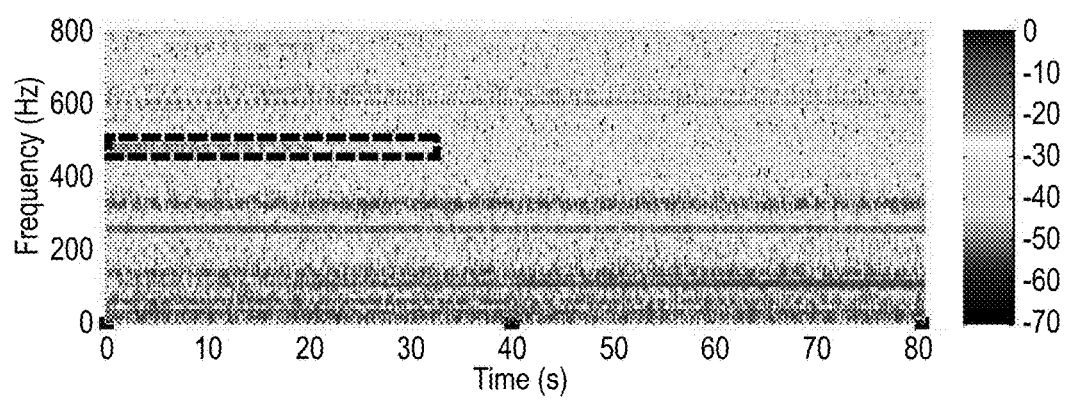
FIG. 5 is a time-frequency spectrogram for a WFBLSG under linear load at a loading level of 60%.

The first example method will now be illustrated with reference to another actual electric machine 4 under known loading conditions. In the following example, the electric machine 4 is again a WFBLSG under linear load, however the level of loading is 60%. The spectrogram generated by the signal processing unit 28 in step S4 for this type of electric machine 4 under these loading conditions is shown in FIG. 5.

In step S6, the type of electric machine 4 being tested is identified as a WFBLSG under linear load at 60% loading. An unbalance signature frequency, an unbalance signature threshold condition, a stator signature frequency and a stator signature threshold condition for a WFBLSG under linear load at 60% loading are retrieved from the knowledge base. In the present example, the unbalance signature frequency is 500 Hertz, the unbalance signature threshold condition is less than −25 decibels, the stator signature frequency is 100 Hertz and the stator signature threshold condition is greater than −5 decibels.

In step S8, the amplitude at the unbalance signature frequency of 500 Hertz (i.e. the extracted unbalance amplitude) is extracted from the spectrogram and determined to be −20 decibels. Likewise, the amplitude at the stator signature frequency of 100 Hertz (i.e. the extracted stator amplitude) is extracted from the spectrogram and determined to be −10 decibels.

In step S10, the extracted unbalance amplitude of −20 decibels is determined not to meet the requirements of the unbalance signature threshold condition of being less than −25 decibels. Accordingly, the electric machine 4 is determined not to have a load unbalance condition, whereupon step S12 is carried out.

In step S12, the extracted stator amplitude of −10 decibels is determined not to meet the requirements of the stator signature threshold condition of being greater than −5 decibels. Accordingly, the electric machine 4 is determined not to have a stator winding fault condition and to be healthy, whereupon step S2 is carried out.

This process repeats, until approximately 20 seconds has elapsed. After 20 seconds has elapsed, in step S8, the extracted stator amplitude is again determined to be −10 decibels. In contrast, the extracted unbalance amplitude is now determined to be −35 decibels.

In step S10, the extracted unbalance amplitude of −35 decibels is determined to meet the requirements of the unbalance signature threshold condition of being less than −25 decibels. Accordingly, the electric machine 4 is determined to have a load unbalance condition, whereupon step S2 is carried out.

This process repeats for the entirety of the remainder of the 80 second period, shown in FIG. 5.

Figure 6:
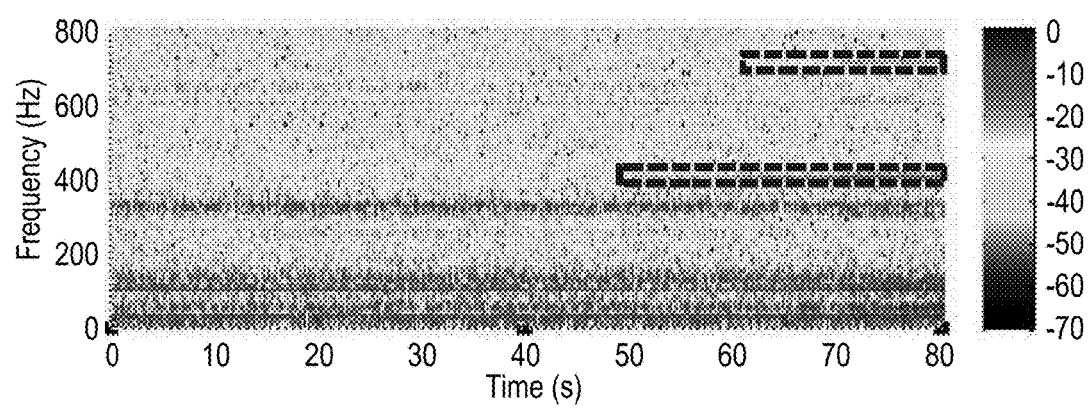
FIG. 6 is a time-frequency spectrogram for a WFBLSG under non-linear load at a loading level of 40%.

The first example method will now be illustrated with reference to yet another actual electric machine 4 under known loading conditions. In the following example, the electric machine 4 is a WFBLSG subjected to 40% loading, as per the example shown in FIG. 4. However, the WFBLSG is under a non-linear load, rather than a linear load. The spectrogram generated by the signal processing unit 28 in step S4 for this type of electric machine 4 under these loading conditions is shown in FIG. 6.

In step S6, the type of electric machine 4 being tested is identified as a WFBLSG under non-linear load at 40% loading. An unbalance signature frequency, an unbalance signature threshold condition, a first stator signature frequency and a first stator signature threshold condition for a WFBLSG under non-linear load at 40% loading are retrieved from the knowledge base. For the type of electric machine 4 being tested under the specific type of load conditions, there is also a second stator signature frequency and a second signature threshold condition.

In the present example, the unbalance signature frequency is 500 Hertz, the unbalance signature threshold condition is less than −30 decibels, the first stator signature frequency is 400 Hertz, the first stator signature threshold condition is greater than −20 decibels, the second stator signature frequency is 700 Hertz and the second stator signature threshold condition is greater than −25 decibels.

In step S8, the amplitude at the unbalance signature frequency of 500 Hertz (i.e. the extracted unbalance amplitude) is extracted from the spectrogram and determined to be −25 decibels. Likewise, the amplitude at the first stator signature frequency of 400 Hertz (i.e. the first extracted stator amplitude) is extracted from the spectrogram and determined to be −30 decibels, and the amplitude at the second stator signature frequency of 700 Hertz (i.e. the second extracted stator amplitude) is extracted from the spectrogram and determined to be −30 decibels.

In step S10, the extracted unbalance amplitude of −25 decibels is determined not to meet the requirements of the unbalance signature threshold condition of being less than −30 decibels. Accordingly, the electric machine 4 is determined not to have a load unbalance condition, whereupon step S12 is carried out.

In step S12, the first extracted stator amplitude of −30 decibels is determined not to meet the requirements of the first stator signature threshold condition of being greater than −20 decibels. Likewise, the second extracted stator amplitude of −30 decibels is determined not to meet the requirements of the second stator signature threshold condition of being greater than −25 decibels. Accordingly, the electric machine 4 is determined not to have a stator winding fault condition and to be healthy, whereupon step S2 is carried out.

This process repeats, until approximately 50 seconds has elapsed. After 50 seconds has elapsed, in step S8, the extracted unbalance amplitude is again determined to be −25 decibels and the second extracted stator amplitude is again determined to be −30 decibels. In contrast, the first extracted unbalance amplitude is now determined to be −15 decibels.

In step S10, the extracted unbalance amplitude of −25 decibels is determined not to meet the requirements of the unbalance signature threshold condition of being less than −30 decibels. Accordingly, the electric machine 4 is determined not to have a load unbalance condition, whereupon step S12 is carried out.

In step S12, the first extracted stator amplitude of −15 decibels is determined to meet the requirements of the first stator signature threshold condition of being greater than −20 decibels. Accordingly, the electric machine 4 is determined to have a stator winding fault condition.

In alternative example methods, both the requirements of the first stator signature threshold condition and the second stator signature threshold condition must be met in order for the electric machine 4 to be determined to have a stator winding fault condition.

Figure 7:
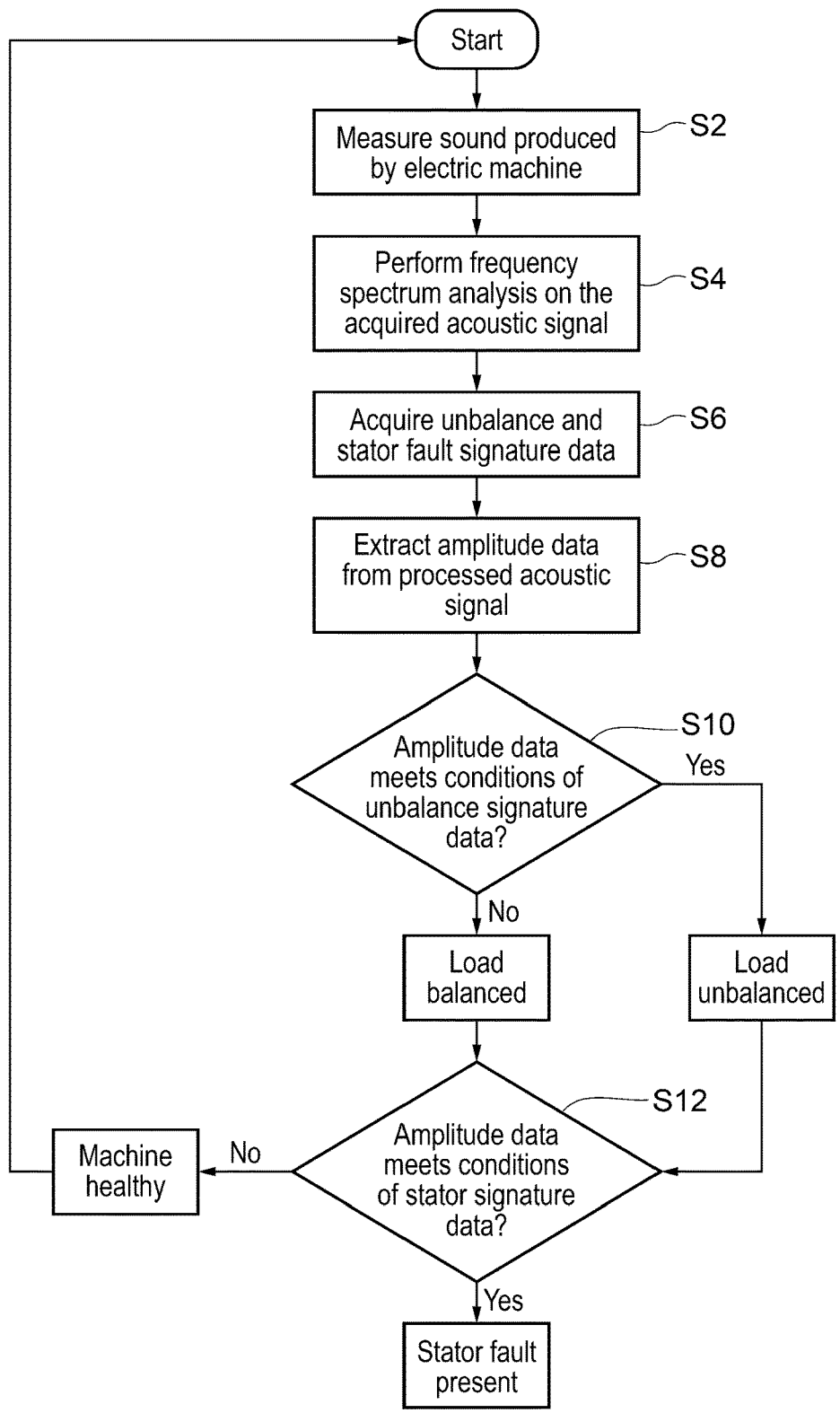
FIG. 7 is a flow diagram of a second example method performed by the fault diagnosis apparatus using the architecture of FIG. 2.

As outlined above, in the first example method, the step of determining whether the electric machine 4 has a stator winding fault (i.e. step S12) is only ever carried out if the electric machine 4 is determined not to be unbalanced (in step S10). Accordingly, step S10 acts as a preliminary check, reducing the number of false alarms of occurrences of stator winding faults. A second example method is shown in FIG. 7, in which step S12 is carried out regardless of whether the electric machine 4 is determined to have a stator winding fault. Specifically, in the second example architecture, step S12 is carried out regardless of the outcome of step S10.

Figure 8:
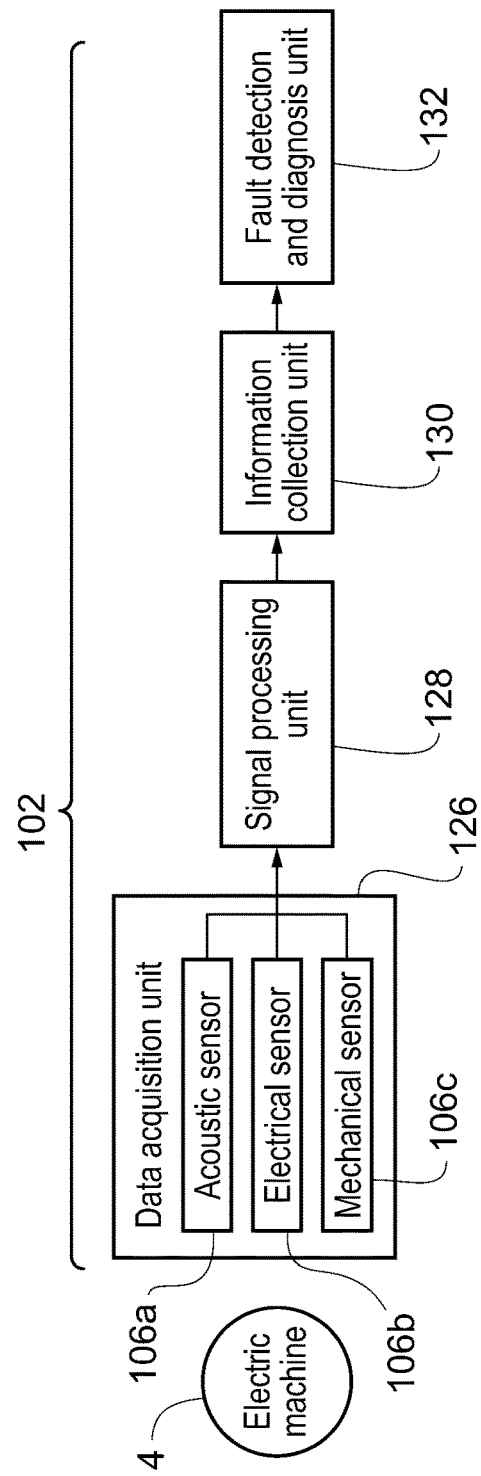
FIG. 8 is a schematic view of a second example of a system architecture used in the fault diagnosis apparatus.

FIG. 8 shows a second example architecture used in a fault diagnosis apparatus 102. As per the fault diagnosis apparatus 2 of the first example architecture, the fault diagnosis apparatus 102 of the second example architecture is configured to diagnose a fault condition present in the electric machine 4.

The fault diagnosis apparatus 102 comprises a data acquisition unit 126, a signal processing unit 128, an information collection unit 130 and a fault detection and diagnosis unit 132. The data acquisition unit 126 comprises an acoustic sensor 106a substantially corresponding to the sensor 6 of the first example system architecture 2. The data acquisition unit 126 further comprises an electrical sensor 106b and a mechanical sensor 106c.

Figure 9:
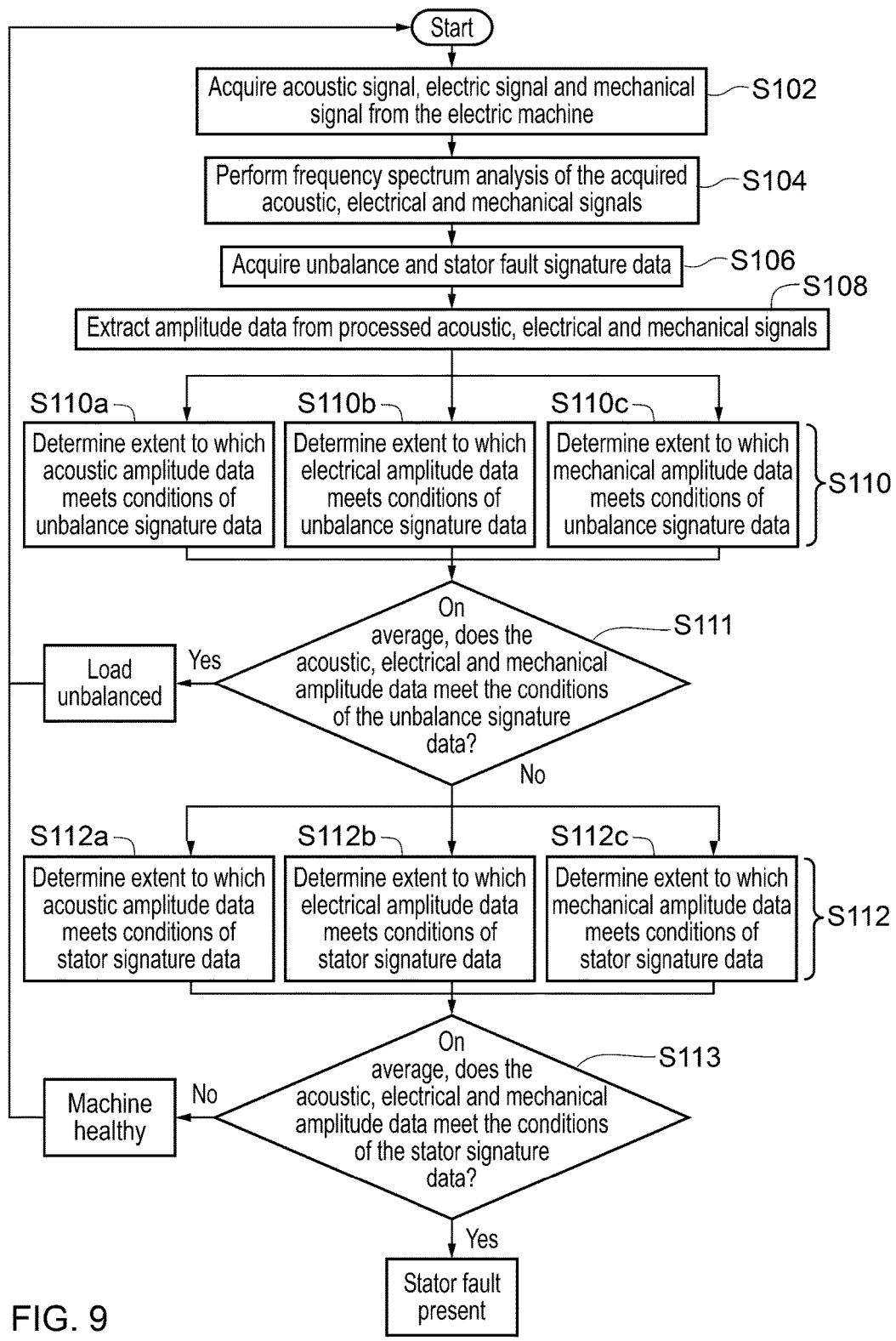
FIG. 9 is a flow diagram of a third example method performed by the fault diagnosis apparatus using the architecture of FIG. 8.

The fault diagnosis apparatus 102 is described with reference to FIG. 9, which shows a flow diagram of a third example method performed by the fault diagnosis apparatus 102 using the second example architecture. Upon initiation of the fault diagnosis apparatus 102, step S102 is carried out by the data acquisition unit 126. Step S102 substantially corresponds to step S2, but additionally comprises measuring and generating a signal corresponding to one or more of terminal voltage, exciter field current, main field current or exciter current using the electrical sensor 106b, and measuring and generating a signal corresponding to one or more of vibration or temperature using the mechanical sensor 106c. In other examples, the electrical sensor 106b may measure and generate a signal corresponding to any type of electrical parameter and the mechanical sensor 106c may measure and generate a signal corresponding to any type of mechanical parameter. The signals generated by the acoustic sensor 106a, the electrical sensor 106b and the mechanical sensor 106c are outputted in the form of separate electrical signals to the signal processing unit 128.

Step S104 is carried out by the signal processing unit 128. Step S104 substantially corresponds to step S4. Specifically, a spectrograph in the signal processing unit 128 generates a frequency-time spectrogram (hereinafter referred to as an acoustic spectrogram) from the signal produced by the acoustic sensor 106a. In addition, the signal processing unit 128 generates separate frequency-time spectrograms from the signals produced by the electrical sensor 106b (hereinafter referred to as the electrical spectrogram) and the mechanical sensor 106c (hereinafter referred to as the mechanical spectrogram).

Step S106 is carried out by the information collection unit 130. Step 106 substantially corresponds to step S6. As per step S6, step S106 comprises retrieving load unbalance condition signature data and stator winding fault condition signature data from the knowledge base for the type of electric machine 4 being analyzed under the applicable load conditions. As is done for the first example architecture 2, load unbalance condition signature data and stator winding fault condition signature data is retrieved for the acoustic spectrogram. In addition, in step 106, load unbalance condition signature data and stator winding fault condition signature data is retrieved for the electrical spectrogram and the mechanical spectrogram.

Step S108 is also carried out by the information collection unit 130. Step S108 substantially corresponds to step S8, however extracted unbalance amplitudes and extracted stator amplitudes are additionally extracted from the electrical spectrogram and the mechanical spectrogram at their respective unbalance signature frequencies and stator signature frequencies. The extracted unbalance amplitudes and the extracted stator amplitudes, along with the unbalance signature threshold conditions and the stator signature threshold conditions for each of the acoustic spectrogram, the electrical spectrogram and the mechanical spectrogram are outputted to the fault detection and diagnosis unit 132, whereupon step S110 takes place.

Step S110 is carried out by the fault detection and diagnosis unit 132. Step S110 comprises three steps S110a, S110b, S110c that are carried out simultaneously or sequentially. Step S110a is similar to step S10. As previously mentioned, step S10 involves determining whether the extracted unbalance amplitude meets the conditions prescribed by the unbalance signature threshold condition. This is a binary determination; the extracted unbalance amplitude is either determined to meet the conditions prescribed by the unbalance signature threshold condition or determined not to meet the conditions prescribed by the unbalance signature threshold condition. In contrast, in step S110a, the extent to which the extracted unbalance amplitude meets the conditions prescribed by the unbalance signature threshold condition is determined. In particular, a difference between the extracted unbalance amplitude and the unbalance signature threshold may be calculated. If the extracted unbalance amplitude does not meet the unbalance signature threshold condition, then the difference is negative, whereas if it does, then the difference is positive (or vice versa). A similar determination is carried out for the electrical and mechanical spectrograms in steps S110b and S110c.

In step S111, the difference values generated in steps S110a, S110b and S110c are averaged. It may be necessary for the values to be normalized prior to averaging. The values may also be weighted in the average such that certain measures make a greater contribution. The weighting may be based on the expected accuracy of the measure or some other reason. If the averaged values from the acoustic, electrical and mechanical spectrograms exceed a threshold, the electric machine 4 is determined to have an unbalance load condition, whereupon step S102 is carried out. The threshold may be set at zero or some other value. If the averaged values from the acoustic, electrical and mechanical spectrograms do not exceed the threshold, the electric machine 4 is determined not to have an unbalance load condition, whereupon step S112 is carried out.

Step S112 is also carried out by the fault detection and diagnosis unit 132. Step S112 comprises three steps S112a, S112b, S112c that are carried out simultaneously or sequentially. Step S112a is similar to step S12. As previously mentioned, step S12 involves determining whether the extracted stator amplitude meets the conditions prescribed by the stator signature threshold condition. In contrast, in step S112a, the extent to which the extracted stator amplitude meets the conditions prescribed by the stator signature threshold condition is determined. In particular, a difference between the extracted stator amplitude and the stator signature threshold may be calculated. If the extracted stator amplitude does not meet the stator signature threshold condition, then the difference is negative, whereas if it does, then the difference is positive (or vice versa). A similar determination is carried out for the electrical and mechanical spectrograms in steps S112b and S112c.

In step S113, the difference values generated in steps S110a, S110b and S110c are averaged. It may be necessary for the values to be normalized prior to averaging. The values may also be weighted in the average such that certain measures make a greater contribution. The weighting may be based on the expected accuracy of the measure or some other reason. If the averaged values from the acoustic, electrical and mechanical spectrograms exceed a threshold, the electric machine 4 is determined to have a stator winding fault. The threshold may be set at zero or some other value. If the averaged values from the acoustic, electrical and mechanical spectrograms do not exceed the threshold, the electric machine 4 is determined not to have stator winding fault and to be healthy, whereupon step S102 is carried out.

It will be appreciated that the method described above allows multiple modalities to be combined to provide a more accurate determination. In particular, a single measurement technique (or even two measurement techniques) may not identify a load unbalance or a stator winding fault, but provided the other measurements are sufficiently conclusive to offset this, then a load unbalance condition or stator winding fault will be identified.

Figure 10:
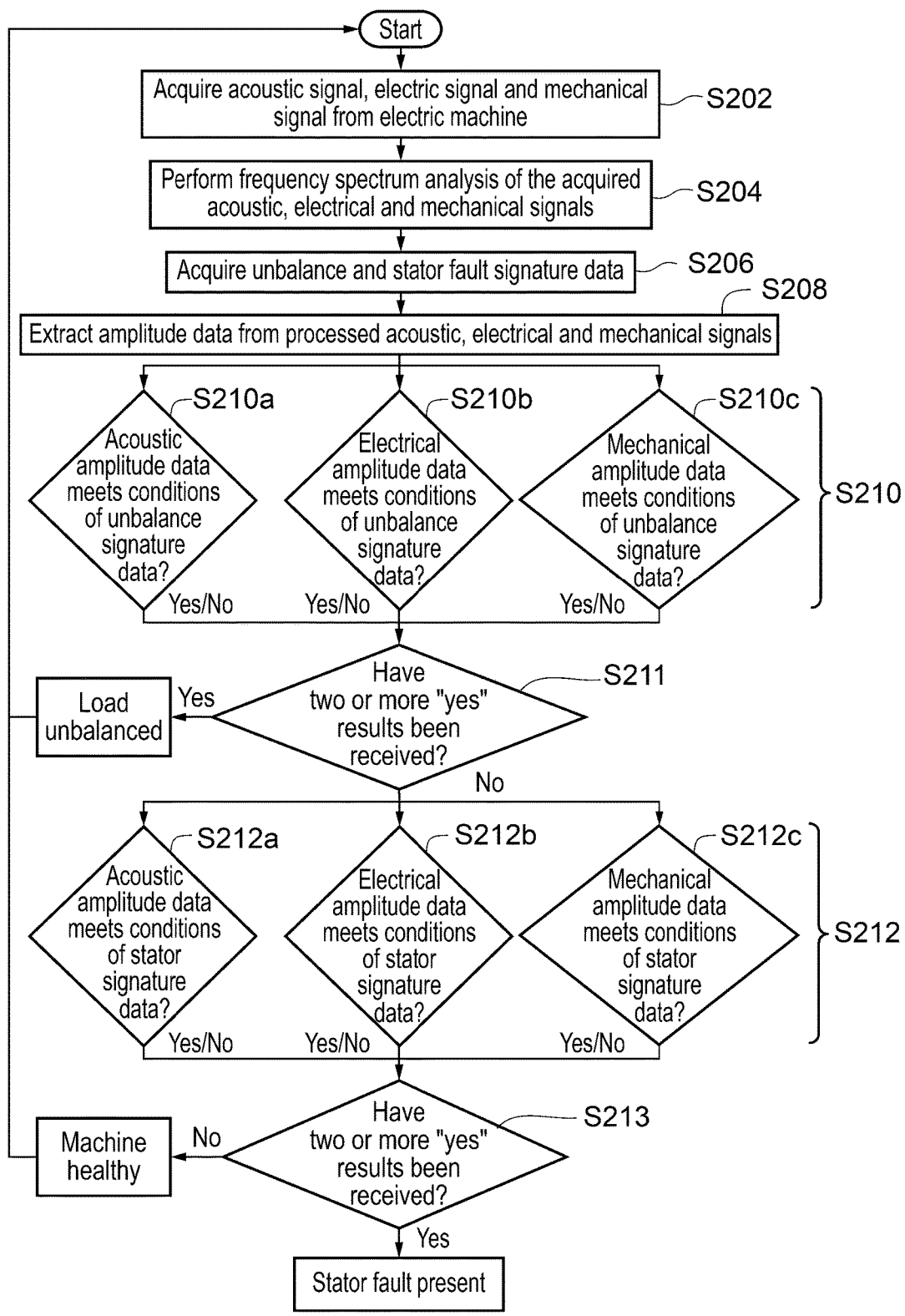
FIG. 10 is a flow diagram of a fourth example method performed by the fault diagnosis apparatus using the architecture of FIG. 8.

FIG. 10 shows a fourth example method performed by the fault diagnosis apparatus 102 using the second example architecture. The fourth example method substantially corresponds to the third example method. In particular, steps S202, S204, S206 and S208 correspond to steps S102, S104, S106 and S108, respectively. Step S210 comprises steps S210a, S210b and S210c, which substantially correspond to steps S110a, S110b and S110c, respectively. However, as per step S10, in each of steps S210a, 210b and 210c, a binary (i.e. yes/no) decision is made as to whether their respective extracted unbalance amplitudes meet the conditions prescribed by their respective unbalance signature threshold conditions.

In step S110, if two or more of the outputs from steps S210a, 210b and 210c indicate that the extracted unbalance amplitudes have met the conditions prescribed by their respective unbalance signature threshold conditions, the electric machine 4 is determined to have a load unbalance condition, whereupon step S202 is carried out. If one or no outputs from steps S210a, 210b and 210c indicate that the extracted unbalance amplitudes have met the conditions prescribed by their respective unbalance signature threshold conditions, the electric machine 4 is determined not to have a load unbalance condition, whereupon step S212 is carried out.

Step S212 comprises steps S212a, S212b and S212c, which substantially correspond to steps S112a, S112b and S112c, respectively. However, as per step S12, in each of steps S112a, S112b and S112c, a binary (i.e. yes/no) decision is made as to whether their respective extracted stator amplitudes meet the conditions prescribed by their respective stator signature threshold conditions.

In step S213, if two or more of the outputs from steps S212a, S212b and S212c indicate that the extracted stator amplitudes have met the conditions prescribed by their respective stator signature threshold conditions, the electric machine 4 is determined to have a stator winding fault. If one or no outputs from steps S212a, S212b and S212c indicate that the extracted stator amplitudes have met the conditions prescribed by their respective stator signature threshold conditions, the electric machine 4 is determined not to have a stator winding fault, whereupon step S202 is carried out.

By using electrical and mechanical data in addition to acoustic data, the accuracy of fault detection and diagnosis of the third and fourth example methods is improved. In other examples, the acoustic data may be supplemented with only electrical or only mechanical data.

In some arrangements, more than one acoustic sensor 6 may be used, again, in order to improve accuracy.

With reference to the third and fourth example methods, it has been described that the signal processing unit 128 generates separate frequency-time spectrograms from the signals produced by the electrical sensor 106b and the mechanical sensor 106c, and that data extracted from these spectrograms (in conjunction with the acoustic spectrogram) is subsequently used to determine whether the electric machine 4 has a load unbalance condition or a stator winding fault condition. However, the signal processing unit 128 can be used to process the signals produced by the electrical sensor 106b and the mechanical sensor 106c in any known manner in order to produce an output that can be used in steps S106 to S113 and S206 to S213 to determine whether the electric machine 4 has a load unbalance condition or a stator winding fault condition.

The electric machine 4 has been described as being a WFBLSG. However, the electric machine 4 may be any type of electric machine, such as an induction machine or a permanent magnet electric machine, such as a permanent magnet synchronous machine. The electric machine 4 may be or act either as an electric generator or an electric motor. The electric machine 4 may use any type of winding.

It has been described that the fault diagnosis apparatus determines whether the electric machine 4 has a turn-to-turn short circuit fault (i.e. an inter-turn short circuit fault). However, the fault diagnosis apparatus may determine whether the electric machine 4 has other types of stator winding faults such as phase-to-ground faults or phase-to-phase faults. The fault diagnosis apparatus may also be used to identify rotor winding faults.

Although it has been described that the determination as to whether the electric machine 4 is unbalanced is carried out prior to the determination as to whether the electric machine 4 has a stator winding fault, this need not be the case. Instead, the determination as to whether the electric machine 4 has a stator winding fault may be carried out prior to the determination as to whether the electric machine 4 is unbalanced.

The example methods have been described as being carried out over a period of time, for example 80 seconds. The methods may be carried out throughout the entire period of operation of the electric machine 4. If the electric machine 4 is found to have a load unbalance condition or not to have a stator winding fault, the method repeats indefinitely. However, in alternative arrangements, the method may not repeat. Instead, a single iteration of the method may be carried out. Multiple non-repeating iterations of the method may be carried out at regular intervals of time, for example 10 second intervals.

In the example methods, it has been described that a spectrogram is produced from which an extracted unbalance amplitude and an extracted stator amplitude can be obtained. As described previously, a spectrogram is a frequency-time plot, with amplitude at a specific frequency and time represented by way of color, for example. It is not, however, necessary to produce a spectrogram in order to determine extracted unbalance amplitudes and extracted stator amplitudes. Instead, individual amplitude-frequency plots may be produced, one for each cycle of the method.

The electric machine 4 may be used for any application, for example aeronautical applications, marine applications and energy and nuclear applications. The electric machine 4 may be used for on board power generation. The electric machine 4 may, for example, be used as a shaft generator in energy efficient hybrid propulsion systems, such as those used in marine vessels.

The invention claimed is:

1. A method for diagnosing a fault condition in an electric machine, the method comprising:
measuring at least one physical parameter generated during operation of the electric machine;
analyzing the or each measured parameter in a frequency domain; and
determining whether the electric machine has a stator or rotor winding fault based on a comparison of an amplitude of the or each analyzed parameter at a first predetermined frequency and a first threshold amplitude for the first predetermined frequency;
wherein the at least one physical parameter comprises a sound generated by the electric machine; and
further comprising determining a type of electric machine and/or a loading the electric machine is subjected to, wherein the first predetermined frequency and its respective first threshold amplitude are determined based on the type of electric machine and/or its loading.

2. A method according to claim 1, wherein the first threshold amplitude is an upper threshold amplitude, and wherein the electric machine is determined to have the stator or rotor winding fault if the amplitude of the or each analyzed parameter at the first predetermined frequency is above the upper threshold amplitude.

3. A method according to claim 1, further comprising determining whether the electric machine is unbalanced based on a comparison of an amplitude of the or each analyzed parameter at a second predetermined frequency and a second threshold amplitude for the second predetermined frequency.

4. A method according to claim 3, wherein the step of determining whether the electric machine has the stator or rotor winding fault is carried out only if it is determined that the electric machine is not unbalanced.

5. A method according to claim 3, wherein the second threshold amplitude is a lower threshold amplitude, and wherein the electric machine is determined to be unbalanced if the amplitude of the or each analyzed parameter at the second frequency is below the lower threshold amplitude.

6. A method according to claim 1, wherein the at least one physical parameter further comprises an electrical parameter and/or a mechanical parameter of the electric machine.

7. A method according to claim 6, wherein determining whether the electric machine has the stator or rotor winding fault and/or is unbalanced is based on an average of the difference between the amplitudes of the analyzed parameters and the threshold amplitudes.

8. A method according to claim 6, wherein the electric machine is determined to be healthy if one or fewer of the parameters have amplitudes which when compared with the respective threshold amplitude satisfy a criteria which suggests that the electric machine has the stator or rotor winding fault or is unbalanced.

9. A method according to claim 1, wherein the loading the electric machine is subjected to comprises a level of loading and/or whether the loading is linear or non-linear.

10. A method according to claim 9, wherein the first predetermined frequency and its first respective threshold amplitude are obtained from a database.

11. A method according to claim 1, wherein the step of analyzing the or each measured parameter in the frequency domain comprises generating a spectrogram from the or each measured parameter, and wherein the amplitude of the or each analyzed parameter is determined from the spectrogram.

12. A method according to claim 1, wherein the sound generated by the electric machine is measured using an acoustic sensor spaced from the electric machine.

13. A method according to claim 1, wherein the electric machine is an electric generator.

14. A method according to claim 13, wherein the electric generator is a Wound Field Brushless Synchronous Generator (WFBLSG).

15. A method according to claim 1, wherein the stator or rotor winding fault is a turn-to-turn short circuit stator or rotor winding fault.

16. A method for diagnosing a fault condition in an electric machine, the method comprising:
    measuring at least one physical parameter generated during operation of the electric machine;
    analyzing the or each measured parameter in a frequency domain; and
    determining whether the electric machine has a stator or rotor winding fault based on a comparison of an amplitude of the or each analyzed parameter at a first predetermined frequency and a first threshold amplitude for the first predetermined frequency;
    wherein the at least one physical parameter comprises a sound generated by the electric machine,
    wherein the at least one physical parameter further comprises an electrical parameter and/or a mechanical parameter of the electric machine, and
    wherein determining whether the electric machine has the stator or rotor winding fault and/or is unbalanced is based on an average of the difference between the amplitudes of the analyzed parameters and the first threshold amplitudes.

17. A fault diagnosis apparatus for diagnosing a fault condition in an electric machine, the fault diagnosis apparatus comprising:
    an acoustic sensor configured to measure a sound generated by the electric machine; and
    a processor configured to:
        analyze the measured sound in a frequency domain; and
        determine whether the electric machine has a stator or rotor winding fault based on an amplitude of the analyzed sound at a first frequency and a first condition; and
        determine a type of electric machine and/or a loading the electric machine is subjected to, wherein the first frequency and its respective first condition are determined based on the type of electric machine and/or its loading.

18. A fault diagnosis apparatus for diagnosing a fault condition in an electric machine, the fault diagnosis apparatus comprising:
    an acoustic sensor configured to measure a sound generated by the electric machine; and
    a processor configured to:
        analyze the measured sound in a frequency domain; and
        determine whether the electric machine has a stator or rotor winding fault based on an amplitude of the analyzed sound at a first frequency and a first condition,
    wherein at least one further measured and analyzed physical parameter comprises an electrical parameter and/or a mechanical parameter of the electric machine, and
    wherein determining whether the electric machine has the stator or rotor winding fault and/or is unbalanced is based on an average of:
        a difference between the amplitude of the analyzed sound at the first frequency and a first threshold amplitude for the first condition, and
        a difference between amplitudes of the at least one further measured and analyzed physical parameter and at least one associated threshold amplitude.

* * * * *